(12) United States Patent
Lin

(10) Patent No.: US 9,035,462 B2
(45) Date of Patent: May 19, 2015

(54) AIRGAP-CONTAINING INTERCONNECT STRUCTURE WITH PATTERNABLE LOW-K MATERIAL AND METHOD OF FABRICATING

(71) Applicant: International Business Machines Corporation, Armonk, NY (US)

(72) Inventor: Qinghuang Lin, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 105 days.

(21) Appl. No.: 13/791,502

(22) Filed: Mar. 8, 2013

(65) Prior Publication Data

US 2013/0207272 A1 Aug. 15, 2013

Related U.S. Application Data

(60) Continuation of application No. 13/473,789, filed on May 17, 2012, now abandoned, which is a division of application No. 11/971,470, filed on Jan. 9, 2008, now Pat. No. 8,476,758.

(51) Int. Cl.
| | |
|---|---|
| H01L 23/52 | (2006.01) |
| H01L 23/532 | (2006.01) |
| H01L 21/768 | (2006.01) |
| H01L 23/522 | (2006.01) |

(52) U.S. Cl.
CPC ........ *H01L 23/532* (2013.01); *H01L 21/76808* (2013.01); *H01L 21/7682* (2013.01); *H01L 21/76835* (2013.01); *H01L 23/5222* (2013.01); *H01L 23/5329* (2013.01); *H01L 23/53295* (2013.01); *H01L 2924/12044* (2013.01); *H01L 2924/0002* (2013.01)

(58) Field of Classification Search
USPC ......... 257/734, 770, 741, 773, 774, 506, 508, 257/E23.013, E21.029, E21.564, E21.573, 257/E21.581
See application file for complete search history.

(56) References Cited

U.S. PATENT DOCUMENTS

| | | | |
|---|---|---|---|
| 4,371,605 A | 2/1983 | Renner | |
| 6,087,064 A | 7/2000 | Lin et al. | |
| 6,162,587 A * | 12/2000 | Yang et al. | 430/314 |
| 6,873,026 B1 | 3/2005 | Brunemeier et al. | |
| 7,037,851 B2 | 5/2006 | Gueneau de Mussy et al. | |
| 7,041,748 B2 | 5/2006 | Lin et al. | |
| 7,056,840 B2 | 6/2006 | Miller et al. | |
| 7,358,148 B2 * | 4/2008 | Geffken et al. | 438/421 |
| 7,439,172 B2 * | 10/2008 | Clevenger et al. | 438/619 |
| 2004/0099951 A1 | 5/2004 | Park et al. | |
| 2005/0037604 A1 | 2/2005 | Babich et al. | |
| 2005/0067673 A1 | 3/2005 | Geffken et al. | |
| 2006/0038297 A1 | 2/2006 | Usami et al. | |
| 2006/0105181 A1 | 5/2006 | Lin et al. | |

\* cited by examiner

*Primary Examiner* — Jasmine Clark
(74) *Attorney, Agent, or Firm* — Scully, Scott, Murphy & Presser, P.C.; Daniel P. Morris, Esq.

(57) ABSTRACT

An interconnect structure is provided that includes at least one patterned and cured low-k dielectric material located on a surface of a patterned inorganic antireflective coating that is located atop a substrate. The inorganic antireflective coating comprises atoms of M, C and H wherein M is at least one of Si, Ge, B, Sn, Fe, Ta, Ti, Ni, Hf and La. The at least one cured and patterned low-k dielectric material and the patterned inorganic antireflective coating have conductively filled regions embedded therein and the at least one cured and patterned low-k dielectric material has at least one airgap located adjacent, but not directly in contact with the conductively filled regions.

18 Claims, 3 Drawing Sheets

AIRGAP-CONTAINING INTERCONNECT STRUCTURE WITH PATTERNABLE LOW-K MATERIAL AND METHOD OF FABRICATING

CROSS REFERENCE TO RELATED APPLICATIONS

This application is a continuation of U.S. patent application Ser. No. 13/473,789, filed May 17, 2012, now abandoned, which is a divisional of U.S. patent application Ser. No. 11/971,470, filed Jan. 9, 2008, now U.S. Pat. No. 8,476,758 issued on Jul. 2, 2013, the entire content and disclosure of which are incorporated herein by reference.

FIELD OF THE INVENTION

The present invention relates to an interconnect structure and a method of fabricating the same. More specifically, the present invention relates to an interconnect structure including a patternable dielectric material as an interconnect dielectric and at least one airgap within the patternable dielectric material. The present invention also provides a method of fabricating such a patternable dielectric interconnect structure.

BACKGROUND OF THE INVENTION

It is widely known that the speed of propagation of interconnect signals is one of the most important factors controlling overall circuit speed as feature sizes are reduced and the number of devices per unit area as well as the number of interconnect levels are increased. Throughout the semiconductor industry, there has been a strong drive to increase the aspect ratio (i.e., height to width ratio) and to reduce the dielectric constant, k, of the interlayer dielectric (ILD) materials used to electrically insulate the conductive metal lines. As a result, interconnect signals travel faster through conductors due to a reduction in resistance-capacitance (RC) delays.

State-of-the-art semiconductor chips employ copper (Cu) as the electrical conductor and inorganic organosilicates as the low dielectric constant (low-k) dielectric, and have up to twelve levels of Cu/low-k interconnect layers. These Cu/low-k interconnect layers are fabricated with an iterative additive process, called dual-damascene, which includes several processing steps. For example, a typical dual-damascene process includes film deposition, patterning by lithography and reactive ion etching, liner deposition, Cu metal fill by electrochemical plating, and chemical-mechanical polishing of excessive Cu metal; these steps are described in greater detail in the following paragraphs.

When fabricating integrated circuit wiring within a multi-layered scheme, an insulating or dielectric material, e.g., silicon oxide or a low-k insulator will normally be patterned with several thousand openings to create conductive line openings and/or via openings using photo patterning and plasma etching techniques, e.g., photolithography with subsequent etching by plasma processes. The via openings are typically filled with a conductive metal material, e.g., aluminum, copper, etc., to interconnect the active and/or passive elements of the integrated circuits. The semiconductor device is then polished to level its surface.

A continuous cap layer is then normally deposited over the planarized surface featuring the dielectric material and conductive metallic material. Next, a dielectric material is deposited over the continuous cap layer, via and line openings are created within the dielectric layer as before, another conductive metal material is deposited within the openings and another continuous cap layer is deposited thereon. The process is repeated to fabricate a multi-layer interconnect wiring system. The multi-layer interconnect system built thereby is referred to in the art as a dual-damascene integration scheme.

Unfortunately, the strategy to introduce low-k materials (typically dielectrics whose dielectric constant is below that of silicon oxide) into advanced interconnects is difficult to implement due to the new materials chemistry of the low-k materials that are being introduced. Moreover, low-k dielectrics exhibit fundamentally weaker electrical and mechanical properties as compared to silicon oxide. Moreover, the low-k dielectric alternatives are typically susceptible to damage during the various interconnect processing steps. The damage observed in the low-k dielectric materials is manifested by an increase in the dielectric constant and increased moisture uptake, which may result in reduced performance and device reliability.

One way to overcome the integration challenges of low-k materials is to protect these low-k dielectric materials by adding at least one sacrificial hardmask layer onto a surface of the low-k dielectric material. While the hardmask layer serves to protect the low-k material, the presence of the sacrificial hardmask layer adds enormous process complexity as more film deposition, pattern transfer etch, and removal of hardmask layers are needed.

A state-of-the-art back-end-of-the-line (BEOL) integration process, called a low temperature oxide (LTO) process, employs up to eight layers of sacrificial hardmask materials to fabricate a two-layer dual-damascene interconnect structure.

For example, a via-first LTO integration for forming a dual-damascene interconnect includes the steps of: depositing a dielectric material on a substrate including a patterned conductor; forming at least one via in said dielectric material, such that at least one of the vias is positioned over the patterned conductor; depositing a layer of planarizing material on the dielectric material and in the via; depositing a layer of barrier material on the layer of planarizing material; depositing at least one layer of imaging material on the layer of barrier material; forming at least one trench in the imaging material, barrier material and planarizing material, such that the at least one trench is positioned over the via; removing the imaging material, either after or concurrently with forming the trench in the planarizing material; transferring the at least one trench to the dielectric material, such that at least one of the trenches is positioned over the via; removing the barrier material, either after or concurrently with transferring the at least one trench to the dielectric material; and removing the planarizing material.

A line-first LTO integration for forming a dual-damascene interconnect structure includes the steps of: depositing a dielectric material on a substrate including a patterned conductor; forming at least one trench in the dielectric material, such that the at least one trench is positioned over the patterned conductor; depositing a layer of planarizing material on the dielectric material and in the trench; depositing a layer of barrier material on the layer of planarizing material; depositing at least one layer of imaging material on the layer of barrier material; forming at least one via in the imaging material, barrier material and planarizing material, such that at least one of the vias is positioned over the trench and the patterned conductor; removing the imaging material, either after or concurrently with forming the via in the planarizing material; transferring the at least one via to the dielectric material, such that at least one of the vias is positioned over the trench and the patterned conductor; removing the barrier material, either after or concurrently with transferring the at least one via to the dielectric material; and removing the planarizing material.

The integration schemes, such as the LTO one mentioned above, are very complex, inefficient, and costly. For example, the via-first LTO integration scheme requires ten layers of films and twenty-one process steps to form a two-layer dual-damascene dielectric structure. In other words, 80% of the films are not needed in the final interconnect structure.

Although immensely popular in semiconductor manufacturing, the prior art dual-damascene integration scheme described above suffers from several drawbacks including:

(I) First, it constitutes a signification portion of manufacturing cost of advanced semiconductor chips as many layers, up to twelve layers for the state-of-the-art chips, are required to connect the minuscule transistors within a chip and to the printed circuit board.

(II) Second, it is a main yield detractor as the many layers of films required to form the interconnects generate chances for defect introduction and, thus, degrade manufacturing yields.

(III) Third, it is very inefficient and embodies enormous complexity. The current dual-damascene integration scheme requires many sacrificial films (80% of the film stack) to pattern and protect the fragile interlayer dielectric films from damage during processing. These sacrificial patterning and protective films have to be removed after patterning and copper plating.

(IV) Fourth, the performance gain by introduction of new lower-k materials is often offset by the needs for higher-k non-sacrificial materials, such as a cap layer, a hardmask layer, or a thicker copper barrier layer.

(V) Fifth, the prior art complex dual-damascene process lengthens manufacturing turn-around time and R&D development cycle.

(VI) Sixth, the plasma etching process is an expensive and often unreliable process and requires significant up-front capital investment.

In view of the above, there is a need to simplify the formation of interconnects (single-damascene and dual-damascene) including low-k dielectrics for cost-saving and manufacturing efficiency. This is also true in interconnect structures in which at least one airgap is present.

Airgaps are typically used in the prior art as means for lowering the effective dielectric constant of the interconnect structure. Lower the effective dielectric constant of an interconnect structure is important in the semiconductor industry since such structures have lower resistance associated therewith. In prior art interconnect structures, airgaps are introduced into the structure utilizing many additional processing steps which raise the production cost of the structure being manufactured. As such, a new method of providing an airgap-containing interconnect structure is also needed which avoids the numerous steps that are used in the prior art for fabricating such an interconnect structure.

SUMMARY OF THE INVENTION

The problems described above in prior art processes of fabricating airgap-containing interconnect structures are solved by using a dramatically simplified integration method of this invention. The present invention thus relates to a method of forming airgap-containing interconnect structures that are part of integrated circuits and microelectronic devices with patternable dielectrics combined with a particular antireflective coating.

This invention circumvents the prior art drawbacks of current integration by combining the functions of a photoresist and a dielectric material into one material. This one material, called a photo-patternable low-k dielectric (or patternable low-k material for short), acts as a photoresist during the lithographic patterning process, and as such, no separate photoresist is required. After lithographic patterning, the patternable low-k dielectric is subsequently converted into a low-k material during a post patterning cure. In this way, the inventive method avoids plasma etching and the complex sacrificial film stack and processes required for patterning. After lithographically patterning the patternable low-k dielectric of the invention, the pattern within the patternable low-k dielectric is filled with a conductive material and then planarized. At least one airgap is then introduced into the patternable low-k dielectric material in a region adjacent to, but not directly abutting, the conductively filled regions of the patternable low-k dielectric material. The airgap extends above the upper surface of the patternable low-k dielectric and into and through a dielectric capping layer located above the conductively-filled patternable low-k dielectric material. An airgap cap is then formed atop the dielectric capping layer essentially sealing the top of the airgap from other interconnect levels that may be formed atop this level of the interconnect structure.

In the inventive method, an antireflective coating layer is required for patterning of a patternable low-k material via lithography. Unfortunately, conventional organic antireflective coatings are generally not suitable for the lithography of a patternable low-k material as the antireflective coating layer is a permanent part of the interconnect structure. These organic antireflective coatings typically cannot withstand high temperature processes such as, for example, the high temperature during either the curing of the patternable low-k dielectric or annealing of the interconnect metal.

Thus, the present invention employs an antireflective coating for lithography and interconnect integration of patternable low-k materials. The antireflective coating that is employed in the present invention is a permanent part of the airgap-containing interconnect structure and is an inorganic material that is formed by vapor or liquid phase deposition including, for example, chemical vapor deposition (CVD), plasma enhanced chemical vapor deposition (PECVD), physical vapor deposition (PVD), and atomic layer deposition (ALD), spin-on coating, spray coating, dip coating.

The inorganic ARC employed in the present invention is a composition that includes atoms of M, C and H, wherein M is at least one of Si, Ge, B, Sn, Fe, Ta, Ti, Ni, Hf and/or La. The inorganic ARC may optionally include atoms of O, N, S, F or mixtures thereof. In some embodiments, M is preferably Si.

Specifically, this invention relates to a simplified method of fabricating an interconnect structure including at least one airgap located within at least one patternable dielectric that is located atop the inorganic ARC mentioned above.

In general terms, the method of the present invention includes:

providing at least one patternable low-k material on a surface of an inorganic antireflective coating (ARC) that is located atop a substrate, said inorganic ARC comprises atoms of M, C and H wherein M is at least one of Si, Ge, B, Sn, Fe, Ta, Ti, Ni, Hf and La;

forming at least one interconnect pattern within said at least one patternable low-k material, said at least one interconnect pattern is formed without utilizing a separate photoresist material;

curing said at least one patternable low-k material into a dielectric material having a dielectric constant of not more than 4.3;

filling said at least one interconnect pattern with a conductive material;

forming a stack comprising a dielectric cap and a block mask located atop said at least one cured patternable-low-k dielectric material;

forming at least one airgap through said stack and into said at least one cured patternable low-k dielectric material; and forming an airgap cap atop said dielectric cap of said stack.

In some embodiments of this method of the present invention, the antireflective coating (ARC) further includes atoms of X, wherein X is one of O, N, S and F. In another embodiment of the present invention, a dielectric cap is formed on top of the substrate prior to forming the ARC.

The present invention also contemplates a step of forming contact holes through the antireflective coating or material stack including the antireflective coating and the dielectric cap after forming the interconnect patterns.

In yet a further embodiment of the present invention, the conductive material is Al, Cu, or a Cu alloy. A planarization process such as chemical mechanical polishing may follow the step of filling the interconnect patterns.

In any of the embodiments mentioned above, the interconnect patterns may comprise via openings, line openings, a combination of via openings located beneath line openings or a combination of line openings located beneath via openings. In one embodiment, it is preferred to have via openings located beneath line openings. It is noted that in the present invention each individual pair of line/via openings or via/line openings is interconnected.

The present invention contemplates the use of positive-tone patternable low-k materials, negative-tone patternable low-k materials or any combination thereof.

In a preferred embodiment of present invention, the inventive method includes the steps of:

providing a first patternable low-k material on a surface of an inorganic antireflective coating (ARC) that is located atop a substrate, said inorganic ARC comprises atoms of M, C and H wherein M is at least one of Si, Ge, B, Sn, Fe, Ta, Ti, Ni, Hf and La;

forming first interconnect patterns within the first patternable low-k material without a separate photoresist;

providing a second patternable low-k material on top of the first patternable low-k material including said first interconnect patterns;

forming second interconnect patterns within said second patternable low-k material without a separate photoresist;

curing at least said second patternable low-k material;

filling said first and second interconnect patterns with a conductive material;

forming a stack comprising a dielectric cap and a block mask located atop said cured second patternable low-k dielectric material;

forming at least one airgap through said stack and into at least said cured second patternable low-k dielectric material; and forming an airgap cap atop said dielectric cap of said stack.

In some embodiments of this method of the present invention, the antireflective coating (ARC) further includes atoms of X, wherein X is one of O, N, S and F. In another embodiment of the present invention, a dielectric cap is formed on top of the substrate prior to forming the ARC.

The present invention also contemplates a step of forming contact holes through the antireflective coating or material stack including the antireflective coating and the dielectric cap after forming the first and second interconnect patterns.

In yet other embodiments of the present invention, a curing step is performed after providing the first interconnect patterns to the first patternable low-k material.

In yet a further embodiment of the present invention, the conductive material includes Al, Cu, or a Cu alloy. A planarization process such as chemical mechanical polishing may follow the step of filling the first and second interconnect patterns.

In any of the embodiments mentioned above, the first interconnect patterns may comprise via openings, while the second interconnect patterns may comprise line openings. This embodiment is preferred over an embodiment in which the first interconnect patterns comprise line openings and the second interconnect patterns comprise via openings.

This invention also relates to a simplified method of fabricating single-damascene low-k interconnect structures with negative-tone or positive-tone patternable low-k dielectrics. This aspect of the present invention comprises the steps of:

providing a patternable low-k material on a surface of an inorganic antireflective coating (ARC) that is located atop a substrate, said inorganic ARC comprises atoms of M, C and H wherein M is at least one of Si, Ge, B, Sn, Fe, Ta, Ti, Ni, Hf and La;

forming interconnect patterns within the patternable low-k material without a separate photoresist;

curing the patternable low-k material;

filling said interconnect patterns with a conductive material;

forming a stack comprising a dielectric cap and a block mask located atop said cured patternable-low-k dielectric material;

forming at least one airgap through said stack and into at least said cured patternable low-k dielectric material; and forming an airgap cap atop said dielectric cap of said stack.

In some embodiments of this method of the present invention, the antireflective coating (ARC) further includes atoms of X, wherein X is one of O, N, S and F. In another embodiment of the present invention, a dielectric cap is formed on top of the substrate prior to forming the ARC.

The present invention also contemplates a step of forming contact holes through the antireflective coating or material stack including the antireflective coating and the dielectric cap after forming the interconnect patterns.

In yet a further embodiment of the present invention, the conductive material is Al, Cu, or a Cu alloy. A planarization process such as chemical mechanical polishing may follow the step of filling the interconnect patterns.

In any of the embodiments mentioned above, the interconnect patterns may comprise via openings or line openings.

This patternable low-k/inorganic ARC method of present invention dramatically reduces the complexity in the fabrication of current interconnect structures. The photoresist used in the prior art integration is no longer needed. In addition to not requiring a separate photoresist, the present invention also does not utilize a plasma etching step for patterning as also required in the prior art interconnect processing schemes. It is further noted that the inventive method reduces the number of layers required to fabricate the interconnect structure and, as such, the present invention reduces the time and cost of fabricating interconnect structures as compared to prior art processes.

In addition to the methods described above, the present invention also relates to airgap-containing interconnect structures which include the patternable low-k dielectric material in a cured state; in the cured state the patternable low-k material serves as the interconnect dielectric. In general terms, the present invention provides an interconnect structure comprising at least one patterned and cured low-k dielectric material located on a surface of a patterned inorganic antireflective coating (ARC) that is located atop a substrate, wherein said inorganic ARC comprises atoms of M, C and H wherein M is at least one of Si, Ge, B, Sn, Fe, Ta, Ti, Ni, Hf and La, said at least one cured and patterned low-k dielectric material and said patterned inorganic antireflective coating having conductively filled regions embedded therein and said at least one cured and patterned low-k dielectric material having at least one airgap located adjacent, but not directly abutting the conductively filled regions.

In some embodiments of the present invention, the antireflective coating (ARC) further includes atoms of X, wherein X is one of O, N, S and F. In some further embodiments of the present invention, a dual-damascene interconnect structure including first and second cured and patterned low-k materials are provided. In yet another embodiment of the present invention, a single-damascene interconnect structure is provided. In some further embodiments, the patterned low-k materials each have Si atoms bonded to cyclic rings via oxygen atoms.

In a further embodiment of the present invention a patterned dielectric cap layer is located beneath the antireflective coating. In still another embodiment of the present invention, another dielectric cap and an airgap cap are present atop the patterned low-k film.

In yet another embodiment of the present invention, the conductively filled regions comprise Al, Cu or a Cu alloy. In an even further embodiment of the present invention, the conductively filled regions comprise a single via, a single line, a combined via/line or a combined line/via.

DETAILED DESCRIPTION OF THE INVENTION

Figure 1A:
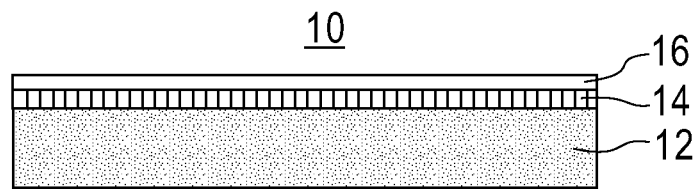
FIGS. 1A-1L are pictorial representations (through cross sectional views) depicting the basic processing steps employed for fabricating a dual-damascene interconnect structure using patternable dielectrics as on-chip electrical insulators on a semiconductor chip in accordance with a highly preferred embodiment of the invention.

The present invention, which provides airgap-containing low-k interconnect structures with a combined inorganic antireflective coating (ARC) and a patternable dielectric and methods of fabricating such interconnect structures, will now be described in greater detail by referring to the following discussion and drawings that accompany the present application. It is noted that the drawings that accompany the present application are provided for illustrative purposes only, and, as such, these drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, this invention circumvents the prior art drawbacks of current integration by combining the functions of a photoresist and a dielectric material into one material. This one material, called a patternable low-k dielectric herein, acts as a photoresist during the lithographic patterning process and, as such a separate photoresist is not required or used in the present invention. After lithographic patterning, the patternable low-k dielectric is subsequently converted into a low-k dielectric during a post patterning cure. In this way, the inventive method avoids plasma etching and the complex sacrificial film stack and processes required for patterning. Specifically, this invention relates to a simplified method of fabricating airgap-containing low-k interconnect structures with at least one patternable dielectric.

In general terms, a method is provided that comprises depositing at least one patternable low-k material on a surface of an inorganic antireflective coating (ARC) that is located atop a substrate, said inorganic ARC comprises atoms of M, C and H wherein M is at least one of Si, Ge, B, Sn, Fe, Ta, Ti, Ni, Hf and La; forming at least one interconnect pattern within said at least one patternable low-k material, said at least one interconnect pattern is formed without utilizing a separate photoresist material; curing the at least one patternable low-k material; filling said at least one interconnect pattern with a conductive material; forming a stack comprising a dielectric cap and a block mask located atop said at least one cured patternable-low-k dielectric material; forming at least one airgap through said stack and into said at least one cured patternable low-k dielectric material; and forming an airgap cap atop said dielectric cap of said stack.

The inventive method can be used to form dual-damascene interconnect structures as well as single-damascene interconnect structures.

The present invention will now be described in reference to FIGS. 1A-1L which illustrate a preferred embodiment of the present invention in which a dual-damascene interconnect structure including an airgap using patternable dielectrics as on-chip electrical insulators on a semiconductor chip is formed.

FIG. 1A illustrates an initial structure 10 that is utilized in this embodiment of the present invention. The initial structure 10 includes a substrate 12, an optional dielectric cap 14 located on a surface of substrate 12, and inorganic antireflective coating 16 located on a surface of the optional dielectric cap 14. In the embodiment illustrated herein below, a single airgap is shown. Although a single airgap is shown, the present invention is not limited to interconnect structures including a single airgap. Instead, the present invention contemplates embodiments in which a plurality of airgaps are formed.

The substrate 12 may comprise a semiconducting material, an insulating material, a conductive material or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP, other III/V or II/VI compound semiconductors, and organic semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate 12 is an insulating material, the insulating material can be an organic insulator, an inorganic insulator or a combination thereof including multilayers. The substrate 12 may also include a patternable low-k dielectric material of this invention as well. When the substrate 12 is a conducting material, the substrate may include, for example, polySi, an elemental metal, alloys of elemental metals, a metal silicide, a metal nitride, conductive nanotubes and nanowires or combinations thereof including multilayers. When the substrate 12 comprises a semiconducting material, one or more semiconductor devices such as, for example, complementary metal oxide semiconductor (CMOS) devices can be fabricated thereon.

The optional dielectric cap 14 is formed on the surface of substrate 12 utilizing a conventional deposition process such as, for example, chemical vapor deposition (CVD), plasma enhanced chemical vapor deposition (PECVD), atomic layer deposition (ALD), spin coating, brush coating, spray coating, dip coating, or evaporation. The dielectric cap 14 comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap can be a continuous layer or a discontinuous layer. It can also be a select cap, such as CoWP. The thickness of the dielectric cap 14 may vary depending on the technique used to form the same as well as the material make-up of the layer. Typically, the dielectric cap 14 has a thickness from about 15 to about 55 nm, with a thickness from about 25 to about 45 nm being more typical.

Next, an inorganic antireflective coating (ARC) 16 is formed on a surface of the optional dielectric cap 14 if present, or directly on a surface of the substrate 12 when the dielectric cap 14 is not present. The ARC 16 may be designed to control reflection of light that is transmitted through the patternable low-k film (to be subsequently formed), reflected off the substrate and back into the patternable low-k film, where it can interfere with incoming light and cause the patternable low-k film to be unevenly exposed. The ARC's optical constants are defined here as the index of refraction n and the extinction coefficient k. In general, ARC 16 can be modeled so as to find optimum optical parameters (n and k values) of ARC as well as optimum thickness. The preferred optical constants of the ARC 16 are in the range from about n=1.4 to n=2.6 and k=0.01 to k=0.78 at a wavelength of 248, 193 and 157, 126 nm and extreme ultraviolet (13.4 nm) radiation.

The optical properties and thickness of ARC 16 is optimized to obtain optimal resolution and profile control of the patternable low-k material during the subsequent patterning steps, which is well known to those ordinarily skilled in the art. The thickness of the ARC 16 may vary depending on the technique used to form the same as well as the material make-up of the layer. Typically, the ARC 16 has a thickness from about 5 to about 200 nm, with a thickness from about 20 to about 140 nm being more typical.

The ARC 16 of the present invention is a composition that includes atoms of M, C and H, wherein M is at least one of Si, Ge, B, Sn, Fe, Ta, Ti, Ni, Hf and La. The inorganic ARC may optionally include atoms of O, N, S, F or mixtures thereof. In some embodiments, M is preferably Si. In some embodiments, the ARC composition may also be referred to as a vapor deposited M:C:H:optionally X material, wherein M and X are as defined above.

The ARC 16 is produced by a vapor or liquid phase deposition (such as, for example, CVD, PECVD PVD, ALD and spin-on coating) method using appropriate Si, Ge, B, Sn, Fe, Ta, Ti, Ni, Hf and La precursors by adjusting process parameters and/or precursor composition. In the case of Si:C:H:X films, these are deposited from methylsilanes with/without additions of nitrogen and/or oxygen and/or fluorine and/or sulfur containing precursors.

Other precursors are also contemplated in the present invention besides methylsilanes. Typically, any precursor including M, C and H can be used in the present invention. That is, any precursor including M and at least one organic ligand can be used. Examples include methylsilanes such as trimethylsilane or tetramethylsilane, siloxanes such as tetramethylcylcotetrasiloxane or octylmethylcyclotetrasiloxane, or methyl gemanes such as trimethylgermane or tetraethylgermane.

Other organic precursors may also be used in the present invention, in addition to the organometallic ones, to tune optical, electrical, mechanical properties of the ARC 16 and/or the film stack. These organic precursors are selected from hydrocarbon and its derivatives, including linear, branched, and ring type molecules.

The atomic % ranges for M are the following: preferably about 0.1 atomic % to about 95 atomic %, more preferably about 0.5 atomic % to about 95 atomic %, most preferably about 1 atomic % to about 60 atomic % and most highly preferably about 5 atomic % to about 50 atomic %.

The atomic % ranges for C are the following: preferably about 0.1 atomic % to about 95 atomic %, more preferably about 0.5 atomic % to about 95 atomic %, most preferably about 1 atomic % to 60 atomic % and most highly preferably about 5 atomic % to 50 atomic %.

The atomic % ranges for H are the following: preferably about 0.1 atomic % to about 50 atomic %, more preferably about 0.5 atomic % to about 50 atomic %, most preferably about 1 atomic % to about 40 atomic % and most highly preferably about 5 atomic % to about 30 atomic %.

The atomic % ranges for X are the following: preferably O atomic % to about 70 atomic %, more preferably about 0.5 atomic % to about 70 atomic %, most preferably about 1 atomic % to about 40 atomic % and most highly preferably about 5 atomic % to about 30 atomic %.

The ARC 16 produced by the present invention has a tunable index of refraction and extinction coefficient which can be optionally graded along the film thickness to match the optical properties of the substrate and the patternable low-k material. The optical properties at DUV and the lithographic features of the ARC produced by the present invention are vastly superior to those obtained by other hardmask materials such as oxide type materials (TEOS, BSG) and nitride type materials.

In one preferred embodiment, the ARC 16 of the present invention is formed by plasma enhanced chemical vapor deposition (PECVD) techniques. In one type of technique, the PECVD process is performed in a parallel plate reactor where the substrate is placed on one of the electrodes.

The following are a list of non-limiting exemplary embodiments in which the ARC is deposited on a substrate that is positioned on a powered electrode and therefore a negative bias is required:

In one embodiment, a Si:C:H film is deposited under the following conditions: precursor=tetramethylsilane at a flow of 10 sccm, pressure in reactor=200 mtorr, substrate temperature=60° C., substrate bias=−200 V.

In a second embodiment, a Si:C:O:H film is deposited under the following conditions: precursor=tetramethylsilane at a flow of 10 sccm mixed with oxygen at a flow of 2 sccm, pressure in reactor=200 mtorr, substrate temperature=180° C., substrate bias=−200 V.

In a third embodiment, a Si:C:H film is deposited under the following conditions: precursor=trimethylsilane at a flow of 10 sccm, pressure in reactor=200 mtorr, substrate temperature=60° C., substrate bias=−200 V.

In a fourth embodiment, a Si:C:O:H film is deposited under the following conditions: precursor=trimethylsilane at a flow of 10 sccm mixed with oxygen at a flow of 2 sccm, pressure in reactor=200 mtorr, substrate temperature=60° C., substrate bias=−200 V.

In a fifth embodiment, a Si:C:O:H film is deposited under the following conditions: precursor=tetramethyltetrasiloxane with argon as a carrier gas at flow of 30 sccm, pressure in reactor=250 mtorr, substrate temperature=60° C., substrate bias=−150 V.

In a sixth embodiment, a Si:C:O:H film is deposited under the following conditions: precursor=tetramethyltetrasiloxane with argon as a carrier gas at flow of 30 sccm, pressure in reactor=250 mtorr, substrate temperature=180° C., substrate bias=−200 V.

In a seventh embodiment, a Si:C:O:H film is deposited under the following conditions: precursor=tetramethyltetrasiloxane with argon as a carrier gas at flow of 30 sccm, pressure in reactor=200 mtorr, substrate temperature=180°, substrate bias=−200 V.

In an eighth embodiment, a Ge:C:H film is deposited under the following conditions: precursor=tetramethylgermane with argon as a carrier gas at flow of 30 sccm, pressure in reactor=50 mtorr, substrate temperature=180° C., substrate bias=−250 V.

In a ninth embodiment, a Ge:C:H film is deposited under the following conditions: precursor=tetramethylgermane with argon as a carrier gas at flow of 30 sccm, pressure in reactor=100 mtorr, substrate temperature=60° C., substrate bias=−50 V.

In a tenth embodiment, a Ge:C:H:O film is deposited under the following conditions: precursor=tetramethylgermane at a flow of 15 sccm mixed with oxygen at a flow of 2 sccm, pressure in reactor=200 mtorr, substrate temperature=60° C., substrate bias=−50 V.

The ARC 16 can be deposited also in a parallel plate PECVD reactor with the substrate positioned on the grounded electrode. It can be deposited in conditions similar to those described in the previous examples but at substrate temperatures up to 400° C., and in high-density plasma type reactors under suitable chosen conditions.

It should be noted that by changing process parameters such as bias voltage, gas mixture, gas flow, pressure and deposition temperature, the film optical constants can be changed. In addition, the composition of the starting precursor as well as the introduction of oxygen, nitrogen, fluorine, and sulfur containing precursors also allows the tunability of these films. The ARC's optical constants are defined here as the index of refraction n and the extinction coefficient k. In general, ARC 16 can be modeled so as to find optimum optical parameters (n and k values) of ARC as well as optimum thickness. The preferred optical constants of the ARC 16 are in the range from about n=1.4 to n=2.6 and k=0.01 to k=0.78 at a wavelength of 248, 193 and 157 nm, 126 nm and extreme ultraviolet radiation.

In addition to the above, the ARC 16 does not interact with the patternable low-k material to induce residue, footing or undercutting.

Moreover, the ARC 16 has good etch selectivity to the patternable dielectric material. Etch selectivities of 1.5-4 to 1 of the ARC to patternable low-k material may be obtained.

Furthermore, the use of the ARC 16 of the present invention maintains the pattern integrity after curing of the patternable low-k material.

Figure 1B:
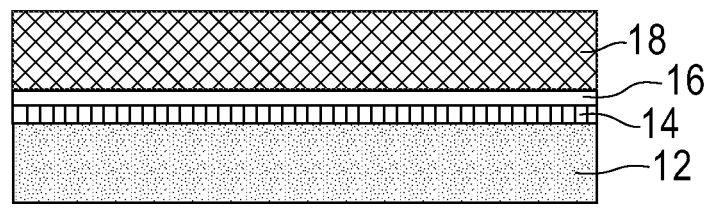

Next, and as illustrated in FIG. 1B, a first patternable low-k material 18, which combines the function of a photoresist and low-k dielectric into one single material is provided. As shown, the first patternable low-k material 18 is provided directly on the surface of the ARC 16.

The first patternable low-k material 18 is provided (i.e., formed) utilizing a conventional deposition process including, for example, spin-on-coating, spray coating, dip coating, brush coating, and evaporation. After applying the first patternable low-k material 18, a post deposition baking step is typically, but not necessarily always, required to remove unwanted components, such as solvent. When performed, the baking step is conducted at a temperature from about 60° to about 200° C., with a baking temperature from about 80° to about 140° C. being even more preferred. The duration of the baking step varies and is not critical to the practice of the present invention.

The thickness of the first patternable low-k material 18 may vary depending on the technique used to form the same as well as the material make-up of the layer. Typically, the first patternable low-k material 18 has a thickness from about 10 to about 10000 nm, with a thickness from about 50 to about 2000 nm being more typical.

As stated above, the first patternable low-k material 18 functions as a photoresist and is converted into a low-k dielectric during post patterning processing, by heat, UV light, electron beam, ion beam, microwave, plasma cure, or combinations thereof. For instance, the first patternable low-k material 18 may comprise a functionalized polymer having one or more acid-sensitive imageable groups. These polymers or blends of polymers can be converted into low-k dielectrics after subsequent processing.

More specifically, the first patternable low-k material 18 comprises photo/acid-sensitive polymers of hydrocarbons, fluorinated hydrocarbons, siloxane, silane, carbosilane, oxycarbosilane, organosilicates, silsesquioxanes and the like. The polymers include, for example, silsesquioxane-type polymers including caged, linear, branched or combinations thereof. In one embodiment, the first patternable dielectric material 18 comprises a blend of these photo/acid-sensitive polymers. The first patternable dielectric material 18 may further comprise at least one sacrificial pore generator to reduce the dielectric constant in its cured form. Examples of patternable dielectric materials useable with the present disclosure are disclosed in U.S. Pat. Nos. 7,041,748, 7,056,840, and 6,087,064, all of which are incorporated herein by reference in their entirety. The dielectric constant of the patternable low-k material 18 after cure is generally no more than 4.3. The dielectric constant may be greater than 1 and up to about 4.3, more preferably from about 1 to about 3.6, even more preferably from about 1 to about 3.0, further more preferably from about 1 to about 2.5, with from about 1 to about 2.0 being most preferred.

The first patternable low-k material 18 is formed from a composition that includes one of the above mentioned polymers or polymer blends, a photoacid generator, a base additive and a solvent typically used in a photoresist. The photoacid generators, base additives and solvents are well known to those skilled in the art and, as such, details regarding those components are not fully provided.

In a preferred embodiment, the first patternable low-k material 18 is a negative patternable low-k material comprising a silsesquioxane polymer or copolymer including, for example, poly(methylsilsesquioxane) (PMS), poly(p-hydroxybenzylsilsesquioxane) (PHBS), poly(p-hydroxyphenylethylsilsesquioxane) (PHPES), poly(p-hydroxyphenylethylsilsesquioxane-co-p-hydroxy-alpha-methylbenzyl silsesquioxane) (PHPE/HMBS), poly(p-hydroxyphenylethylsilsesquioxane-co-methoxybenzylsilsesquioxane) (PHPE/MBS), poly(p-hydroxyphenylethylsilsesquioxane-co-t-butylsilsesquioxane) (PHPE/BS), poly(p-hydroxyphenylethylsilsesquioxane-co-cyclohexylsilsesquioxane) (PHPE/CHS), poly(p-hydroxyphenylethylsilsesquioxane-co-phenylsilsesquioxane) (PHPE/PS), poly(p-hydroxyphenylethylsilsesquioxane-co-bicycloheptylsilsesquioxane) (PHPE/BHS), polyp-hydroxy-alpha-methylbenzylsilsesquioxane) (PHMBS), polyp-hydroxy-alpha-methylbenzylsilsesquioxane-co-p-hydroxybenzylsilsesquioxane) (PHMB/HBS), poly(p-hydroxy-alpha-methylbenzylsilsesquioxane-co-methoxybenzylsilsesquioxane) (PHMB/MBS), poly(p-hydroxy-alpha-methylbenzylsilsesquioxane-co-t-butylsilsesquioxane) (PHMB/BS), poly(p-hydroxy-alpha-methylbenzylsilsesquioxane-co-cyclohexylsilsesquioxane) (PHMB/CHS), poly(p-hydroxy-alpha-methylbenzylsilsesquioxane-co-phenylsilsesquioxane) (PHMB/PS), poly(p-hydroxy-alpha-methylbenzylsilsesquioxane-co-bicycloheptylsilsesquioxane) (PHMB/BHS), poly(p-hydroxybenzylsilsesquioxane-co-p-hydroxyphenylethylsilsesquioxane) (PHB/HPES), and poly(p-hydroxy-alpha-methylbenzylsilsesquioxane-co-p-alpha-methylbenzylsilsesquioxane) (PHMB/MBS).

In the compositions containing a blended polymer component, the silsesquioxane polymer in the blend may be selected from the silsesquioxane polymers described above or may be selected from other silsesquioxane polymers such as, for example, poly(methyl-silsesquioxane) (PMS), poly(p-hydroxybenzylsilsesquioxane) (PHBS), poly(p-hydroxybenzylsilsesquioxane-co-methoxybenzylsilsesquioxane) (PHB/MBS), poly(p-hydroxy-alpha-methylbenzylsilsesquioxane-co-p-alpha-methylbenzylsilsesquioxane) (PHMB/MBS), poly(p-hydroxybenzylsilsesquioxane-co-t-butylsilsesquioxane) (PHB/BS), poly(p-hydroxybenzylsilsesquioxane-co-cyclohexylsilsesquioxane) (PHB/CHS), poly(p-hydrooxybenzylsilsesquioxane-co-phenylsilsesquioxane) (PHB/PS), poly(p-hydroxybenzylsilsesquioxane-co-bicycloheptylsilsesquioxane) (PHB/BHS), and caged silsesquioxanes such as octakis(glycidyloxypropyl)dimethylsilyloxy)silsesquioxane, octakis[cyclohexenyl epoxide)dimethylsilyloxy]silsesquioxane, octakis[4-(hydroxyphenylethyl)dimethylsilyloxy]silsesquioxane, and octakis[{2-(1',1'-bis(trifluoromethyl)-1'-hydroxyethyl)norbornyl}dimethylsilyloxy]silsesquioxane.

If desired, a combination of different silsesquioxane polymers may be used in the blend with the non-silsesquioxane polymer.

For positive tone patternable low-k material, the silicon-containing polymer employed in the present invention may be a homopolymer or a copolymer. Suitable types of such silicon-containing polymers include homopolymers or copolymers containing at least one monomer selected from the group consisting of a siloxane, a silane, a silsesquioxane and a silyne. Highly preferred silicon-backbone polymers are selected from the group consisting of poly(hydroxyphenyl alkyl)silsesquioxanes and poly(hydroxyphenyl alkyl) siloxanes, wherein the alkyl is a $C_{1-30}$ moiety. These preferred silicon-containing polymers are preferably fully or partially protected with acid-sensitive protecting groups.

The positive-tone patternable low-k material may comprise blends of a non-silicon containing polymer and a silicon-containing polymeric additive with a silicon-containing substituent bonded to the polymeric backbone, the silicon-containing polymeric additive may be a homopolymer or copolymer containing at least one monomer having a silicon-containing substituent. The silicon-containing substituent may or may not be acid sensitive. Typically, however the substituent is acid sensitive when containing a $C_2$ alkyl moiety. Preferably, the silicon-containing substituent is attached to a monomer selected from the group consisting of hydroxystyrene, an acrylate, a methacrylate, an acrylamide, a methacrylamide, itaconate, an itaconic half ester or a cycloolefin. Preferred silicon-containing substituents include: siloxane, silane and cubic silsesquioxanes. The silicon-containing polymer may further include silicon-free monomers such as those selected from the group consisting of styrene, hydroxystyrene, acrylic acid, methacrylic acid, itaconic acid and an anhydride such as maleic anhydride and itaconic anhydride.

Preferred monomers containing silicon-containing substituents are trimethylsilyl alkyl acrylate, trimethylsilyl alkyl methacrylate, trimethylsilyl alkyl itaconate, tris(trimethylsilyl)silyl alkyl acrylate tris(trimethylsilyl)silyl alkyl methacrylate, tris(trimethylsilyl)silyl alkyl itaconate, tris(trimethylsilyloxy)silyl alkyl acrylate, tris(trimethylsilyloxy)silyl alkyl methacrylate, tris(trimethylsilyloxy)silyl alkyl itaconate, alkylsilyl styrene, trimethylsilylmethyl(dimethoxy)silyloxy alkyl acrylate, trimethylsilylmethyl(dimethoxy)silyloxy alkyl methacrylate, trimethylsilylmethyl(dimethoxy)silyloxy alkyl itaconate, trimethylsilyl alkyl norbornene-5-carboxylate alkyl, tris(trimethylsilyl)silyl alkyl norbornene-5-carboxylate and tris(trimethylsilyloxy)silyl alkyl norbornene-5-carboxylate, wherein alkyl is a $C_{1-5}$ moiety.

Highly preferred species of these monomers are 3-(3,5,7,9,11,13,15-heptacyclopentylpentacyclo[9.5.1.13,9.15,15.17,13]-octasiloxan-1-yl)propyl methacrylate, 1,3,5,7,9,11,13-heptacyclopentyl-15-vinylpentacyclo[9.5.1.13,9.15,15.17,13]octasiloxane, methacrylamidotrimethylsilane, O-(methacryloxyethyl)-N-(triethoxysilylpropyl)urethane, methacryloxyethoxytrimethylsilane, N-(3-methacryloxy-2-hydroxypropyl)-3-aminopropyltriethoxysilane, (methacryloxymethyl)bis(trimethylsiloxy)methylsilane, (m,p-vinylbenzyloxy)trimethylsilane, methacryloxypropyltris(trimethylsiloxy)silane, methacryloxytrimethylsilane, 3-methacryloxypropylbis(trimethylsiloxy)methylsilane, 3-methacryloxypropyldimethylchlorosilane, methacryloxypropyldimethylethoxysilane, methacryloxypropyldimethylmethoxysilane, methacryloxypropylheptacyclopentyl-T8-silsequioxane, methacryloxypropylmethyldichlorosilane, methacryloxypropylmethyldiethoxysilane, methacryloxypropylmethyldimethoxysilane, (methacryloxymethyl)dimethylethoxysilane, (methacryloxymethyl)phenyldimethylsilane(phenyldimethylsilyl)methylmethacrylate, methacryloxymethyltriethoxysilane, methacryloxymethyltrimethoxysilane, methacryloxymethyltris(trimethylsiloxy)silane, O-methacryloxy(polyethyleneoxy)trimethylsilane, methacryloxypropylpentamethyldisiloxane, methacryloxypropylsilatrane, methacryloxypropylsiloxane macromer, methacryloxypropyl terminated polydimethylsiloxane, methacryloxypropyltrichlorosilane, methacryloxypropyltriethoxysilane, methacryloxypropyltrimethoxysilane, methacryloxypropyltris(methoxyethoxy)silane, p-(t-butyldimethylsiloxy)styrene, butenyltriethoxysilane, 3-butenyltrimethylsilane, (3-acryloxypropyl)trimethoxysilane, (3-acryloxypropyl)tris(trimethylsiloxy)silane, O-(trimethylsilyl)acrylate, 2-trimethylsiloxyethlacrylate, N-(3-acryloxy-2-hydroxypropyl)-3-aminopropyltriethoxysilane, (3-acryloxypropyl)dimethylmethoxysilane, (3-acryloxypropyl)methylbis(trimethylsiloxy)silane, (3-acryloxypropyl)methyldichlorosilane, and (3-acryloxypropyl)methyldimethoxysilane, (3-acryloxypropyl)trichlorosilane.

The extent of protection and the amount of co-monomer present in the silicon containing polymeric additive are such that the patternable low-k material will provide good lithography performance, i.e., high resolution and a good process window. Examples of protecting groups which can be employed are cyclic and branched (secondary and tertiary) aliphatic carbonyls, esters or ethers containing from 3 to 30 carbon atoms, acetals, ketals and aliphatic silylethers.

Examples of cyclic or branched aliphatic carbonyls that may be employed in the present invention include, but are not limited to: phenolic carbonates; t-alkoxycarbonyloxys such as t-butoxylcarbonyloxy and isopropyloxycarbonyloxy. A highly preferred carbonate is t-butoxylcarbonyloxy.

Some examples of cyclic and branched ethers that may be employed in the present invention include, but are not limited to: benzyl ether and t-alkyl ethers such t-butyl ether. Of the aforesaid ethers, it is highly preferred to use t-butyl ether.

Examples of cyclic and branched esters that can be employed in the present invention are carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-g-butyrolactonyl ester, 3-methyl-g-butylrolactonyl ester, bis(trimethylsilyl)isopropyl ester, trimethylsilylethyl ester, tris(trimethylsilyl)silylethyl ester and cumyl ester.

Some examples of acetals and ketals that can be employed in the present invention include, but are not limited to: phenolic acetals and ketals as well as tetrahydrofuranyl, tetrahydropyranyl, 2-ethoxyethyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl. Of these, it is preferred that a methoxycyclohexanyl ketal be employed.

Illustrative examples of silylethers that can be employed in the present invention include, but are not limited to: trimethylsilylether, dimethylethylsilylether and dimethylpropylsilylether. Of these silylethers, it is preferred that trimethylsilylether be employed.

In a preferred embodiment for negative-tone patternable low-k materials of the present invention are two miscible, or compatible, silsesquioxanes. The first silsesquioxane polymer is a linear, branched, caged compound or combination thereof having the following structural formula:

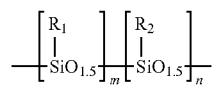

wherein each occurrence of $R_1$ is one or more acidic functional groups for base solubility; each occurrence of $R_2$ is a carbon functionality for controlling polymer dissolution in an aqueous base; $R_1$ is not equal to $R_2$; m and n represent the number of repeating units; m is an integer; and n is zero or an integer greater than zero.

In the present invention, $R_1$ is not limited to any specific functional group, and is preferably selected from among linear or branched alkyls which are substituted with OH, C(O)OH, and/or F; cycloalkyls which are substituted with OH, C(O)OH, and/or F; aromatics which are substituted with OH, C(O)OH, and/or F; arenes that are substituted with OH, C(O)OH, and/or F; and acrylics which are substituted with OH, C(O)OH, and/or F. Examples of preferred $R_1$ include:

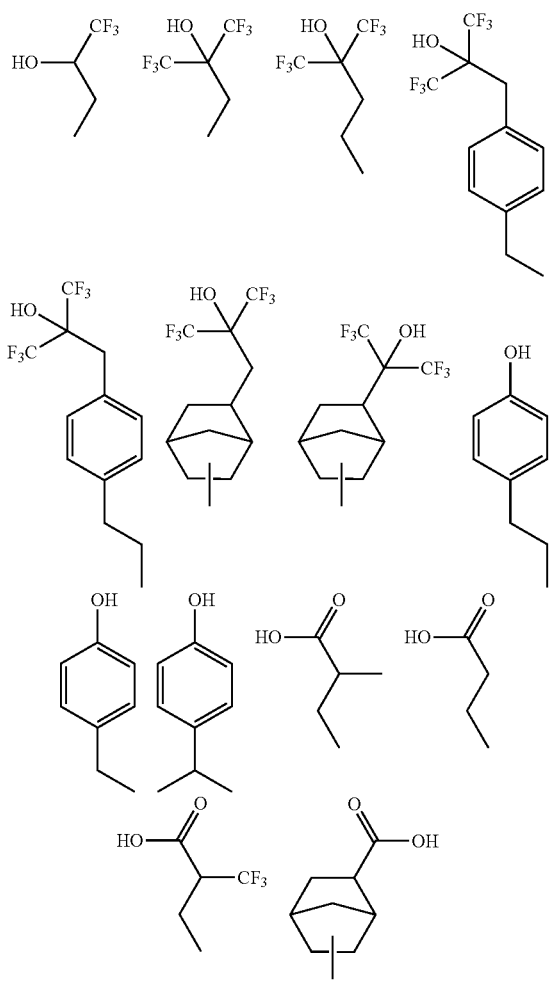

In the present invention, $R_2$ is not limited to any specific carbon functional group, and is preferably selected from among linear or branched alkyls, cycloalkyls, aromatics, arenes, and acrylates.

The silsesquioxane polymers of the present invention have a weight averaged molecular weight of about 400 to about 500,000, and more preferable from about 1500 to about 10,000. The $R_1$ and $R_2$ proportions and structures are selected to provide a material suitable for photolithographic processes and maintaining pattern fidelity after post patterning cure.

A second polymer component of the blend material includes but is not limited to a family of organosilicates known as silsesquioxanes, having the structural formula:

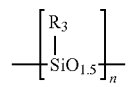

wherein $R_3$ is preferable selected from alkyls, cycloalkyls, aryl, or a combination thereof, and are commercially available from Dow Corning, Shin-Etsu, or JSR, for example. The silsesquioxane is preferably poly(methylsilsesquioxane), and n is an integer about 10 to about 1,000 or more (including copolymers). The silsesquioxane polymers possess silanol end groups, but may also include halosilanes, acetoxysilanes, silylamines, and alkoxysilanes. In a preferred embodiment of the present invention, silsesquioxane polymers, LKD-2021, LKD-2056 and LKD-2064 and the like (from JSR Corporation) which contain silanol end groups are employed.

The composition of the silsesquioxane polymers in the blend formulation is 1 to 99% of the total polymer composition. In the preferred embodiment of the invention, the composition of the acid sensitive polymer is 20 to 80% of the total polymer composition, and even more preferred, 30 to 60%.

A third component of the patternable low-k composition of the present invention is a pore-generating compound, called a porogen. The porogen provides nanoscopic pores in the composition of matter of the present invention which further reduces the dielectric constant of the material.

The porogen that can be used in the present invention includes miscible or phase separated, i.e., non-miscible, polymers that are capable of decomposing under heat or radiation. Alternatively, the porogen may be extracted with supercritical fluid techniques. Examples of porogens that may be employed in the present invention include: homopolymers, copolymers, organic nanoscopic polymers, thermoplastic polymers, star-shaped polymers, dendrimers or crosslinked polymers that remain substantially dormant during the patterning process. After patterning, the pore generating polymers are decomposed or extracted to enhance the dielectric properties of the material of the present invention without severely degrading the pattern fidelity. The decomposition of the porogen may be by heat or radiation-induced.

When a porogen is employed, it is present in the composition of the present invention in an amount of from about 0.1 to about 99.9% of the functionalized polymer. More preferably, the porogen is present in an amount of from about 5 to about 90% of the functionalized polymer.

A fourth component of the present invention is a photosensitive acid generator (PAG) that is compatible with the other components. Examples of preferred PAGs include: -(trifluoro-methylsulfonyloxy)-bicyclo[2.2.1]hept-5-ene-2,3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,371,605. The content of the '605 patent is incorporated herein by reference. A weaker acid generated from a PAG such as N-hydroxy-naphthalimide (DDSN) may be used. Combinations of PAGs may be used.

Condensation in the presence of an acid generated by a photoacid generator under exposure to radiation is not limited to silanols, but may also include halosilanes, acetoxysilanes, silylamines, and alkoxysilanes. Organic crosslinking agents, such as methylphenyltetramethoxymethyl glycouril (methylphenyl powderlink), may also be included in the formulation. Although photoacid generators are preferred for crosslinking, photobase generators can also be used for crosslinking silanol polymers.

The patternable low-k material of the present invention also includes a casting solvent to dissolve the other components. Examples of suitable casting solvent include and are not limited to ethoxyethylpropionate (EEP), a combination of EEP and γ-butyrolactone, propylene-glycol monomethylether alcohol and acetate, propyleneglycol monopropyl alcohol and acetate, and ethyl lactate. Combinations of these solvents may also be used.

In optimizing the photolithography process, an organic base may be added to the formulation. The base employed in the present invention may be any suitable base known in the resist art. Examples of bases include tetraalkylammonium hydroxides, cetyltrimethylammonium hydroxide, and 1,8-diaminonaphthalene. The compositions of the present invention are not limited to any specific selection of base.

The term "acid-sensitive" is used throughout the application to denote imageable functional groups which undergo a chemical reaction in the presence of an acid generated by a photoacid generator under exposure to radiation. The acid-sensitive imageable functional groups employed in the present invention may include acid-sensitive positive-tone functional groups or acid-sensitive negative-tone functional groups. The negative-tone acid-sensitive functional groups are functional groups for causing a crosslinking reaction which causes the exposed areas to be insoluble in a developer to form a negative-tone relief image after development. The positive-tone acid-sensitive functional groups are acid-sensitive protecting groups which cause the exposed region to be soluble in a developer to form positive-tone relief images after development.

The aforementioned patternable low-k materials act as photoresists using patterning; they can be positive-tone or negative-tone, and sensitive to G-line, Mine, DUV (248 nm, 193 nm, 157 nm, 126 nm, and EUV (13.4 µm).

Figure 1C:
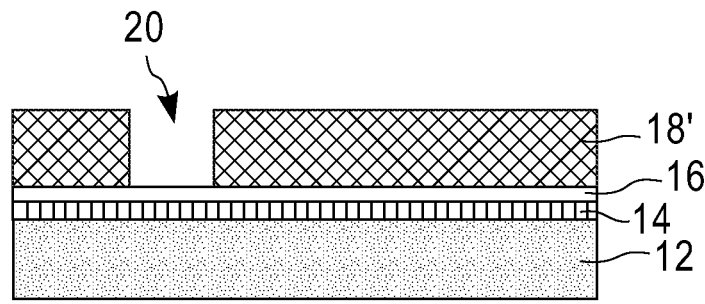

Next, and as shown in FIG. 1C, the first patternable low-k dielectric material 18 is pattern-wise exposed to form latent images of a desired circuitry. An optional post-exposure baking may be required to effect the photochemical reactions. When performed, the baking step is conducted at a temperature from about 60° to about 200° C., with a baking temperature from about 80° to about 140° C. being even more preferred. The duration of the baking step varies and is not critical to the practice of the present invention. After exposure and post-exposure baking, the latent images are developed into the low-k material with an appropriate developer, usually an aqueous base solution, such as 0.26N tetramethylammoniahydroxide (TMAH) solution.

The pattern-wise exposing process can be accomplished in a variety of ways, including, for example, through a mask with a lithography stepper or a scanner with an exposure light source of G-line, Mine (365 nm), DUV (248 nm, 193 nm, 157 nm, 126 nm), Extreme UV (13.4 nm), or an electron beam, an ion beam. The pattern-wise exposing process also includes direct writing without the use of a mask with, for example, light, electron beam, ion beam, and scanning probe lithography. Other patterning techniques that can be used in the present invention include contact printing techniques such as nanoimprint lithography, embroising, micro contact printing, replica molding, microtransfer molding, micromolding in capillaries and solvent-assisted micromolding, thermal assisted embroising, inject printing, and the like.

Specifically, FIG. 1C illustrates the structure that is formed after forming first interconnect patterns 20 within the patternable low-k film 18. The first interconnect patterns 20 may include at least one via opening (as shown and as preferred) or at least one line opening (not shown and less preferred than forming a via opening at this stage of the inventive method). As shown, the first interconnect patterns expose a surface of the ARC 16.

After forming the first interconnect patterns, the low-k material 18 is typically, but not necessarily always, cured to form a cured low-k material 18' (See, FIG. 1C) in which the cured low-k material typically has Si atoms that are bonded to cyclic rings (aliphatic or aromatic) through oxygen atoms. This type of bonding is evident from $C^{13}$NMR or $^{29}$Si NMR. The curing is optional when the first patternable low-k material is negative-tone, but it is required when the first patternable low-k material is a positive-tone material.

Curing is performed in the present invention by a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it coverts the patternable low-k material into a low-k film and maintains pattern fidelity.

In another embodiment, the irradiation cure step is performed by a combination of a thermal cure and an ultra-violet (UV) cure wherein the wavelength of the ultra-violet (UV) light is from about 50 to about 300 nm and the light source for the ultra-violet (UV) cure is a UV lamp, an excimer (exciplex) laser or a combination thereof.

The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from about 50 to about 300 nm. Additionally, the light of the ultra-violet (UV) cure may be enhanced and/or diffused with a lens or other optical diffusing device known to those skilled in the art.

In one embodiment, this post patterning cure is a combined UV/thermal cure. This combined UV/thermal cure is carried on a UV/thermal cure module under vacuum or inert atmosphere, such as $N_2$, He, Ar. Typically, the UV/thermal cure temperature is from about 100° C. to about 500° C., with a cure temperature from about 300° to about 450° C. being more typical. The duration of the UV/thermal cure is from about 0.5 min to about 30 min with a duration from about 1 to about 10 min being more typical. The UV cure module is designed to have a very low oxygen content to avoid degradation of the resultant dielectric materials.

Figure 1D:
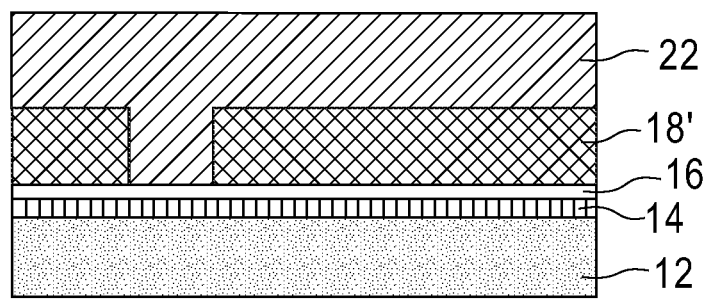

After patterning and optionally curing the first patternable low-k material 18, a second patternable low-k material 22 is then formed providing the structure shown in FIG. 1D. The second patternable low-k material 22 may comprise the same or different material as the first patternable low-k material 18. The deposition processes and thickness mentioned above for the first patternable low-k material 18 are each applicable here for the second patternable low-k material 22. Typically, and in the embodiment illustrated, the first patternable low-k material 18 or the second low-k material 22 is either a negative-tone or a positive-tone material.

Figure 1E:
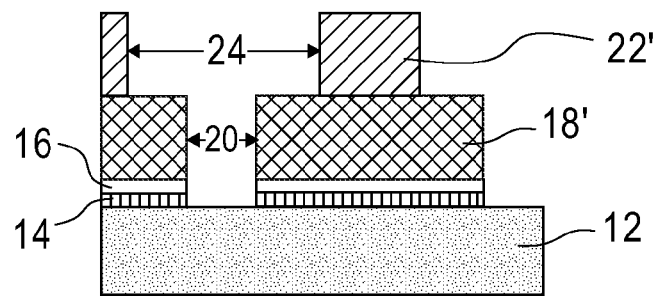

Next, and as shown in FIG. 1E, the second patternable low-k dielectric material 22 is patterned to include second interconnect patterns 24. The patterning of the second patternable low-dielectric material 22 is performed utilizing the same basic processing equipment and steps as those used for patterning the first patternable low-k dielectric material. In the illustrated embodiment, the second interconnect pattern is typically a line. The second interconnect pattern may also be a via, when the first interconnect pattern is a line.

Figure 1F:
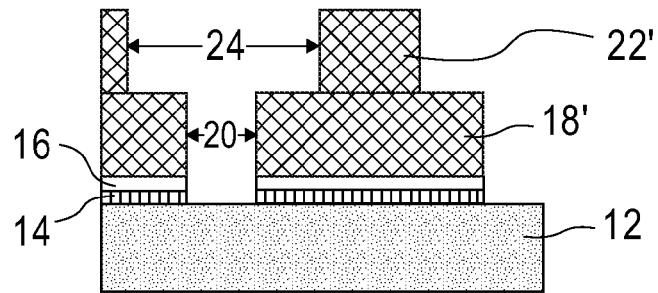
Figure 1G:
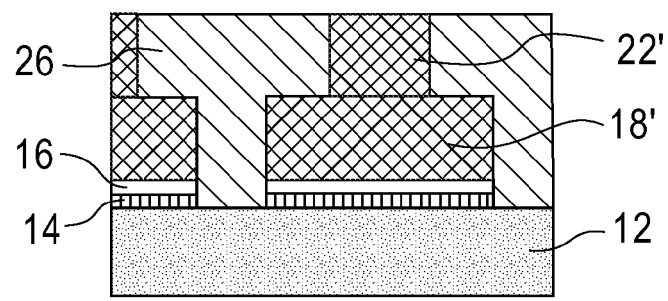

After patterning the second patternable low-k material 22, the structure is cured providing the structure shown in FIG. 1F. In FIG. 1F, reference numeral 22' denotes the cured second low-k material Like the first cured low-k material 18', the cured second low-k material 22' has a dielectric constant within the ranges mentioned above and it also is characterized as typically having Si atoms bonding to cyclic rings (aliphatic or aromatic) via oxygen atoms. If not previously cured, this curing step also cures the first patternable low-k material 18 into a cured low-k material 18' having the bonding mentioned above. The cure methods, equipment and processes mentioned above for the first patternable low-k material 18 are each applicable here for the second patternable low-k material 22.

At this point of the present invention, and as is shown in FIG. 1F, an etching step is performed that etches through the ARC 16 and dielectric cap 14 if present. The etching step to 'open' the ARC 16 and the optional dielectric cap 14 includes any etching process such as, for example, reactive ion etching or gas cluster ion beam etching.

Next, a diffusion barrier liner (not shown), which may comprise Ta, TaN, Ti, TiN, Ru, RuTaN, RuTa, W, WN or any other material that can serve as a barrier to prevent conductive material from diffusing there through, is typically formed into the first and second interconnect patterns by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier liner may comprise a combination of layers. The thickness of the diffusion barrier liner may vary depending on the exact means of the deposition process employed as well as the material and number of layers employed. Typically, the diffusion barrier liner has a thickness from about 4 to about 40 nm, with a thickness from about 7 to about 20 nm being more typical.

Following the formation of the diffusion barrier liner, the remaining region of the first and second interconnect patterns is filled with a conductive material 26 forming a conductive feature. The conductive material 26 used in forming the conductive feature includes, for example, polySi, a conductive metal, an alloy comprising at least one conductive metal, a conductive metal silicide, a conductive nanotube or nanowire or combinations thereof. Preferably, the conductive material 26 that is used in forming the conductive feature is a conductive metal such as Cu, W or Al, with Cu or a Cu alloy (such as AlCu) being highly preferred in the present invention. The conductive material 26 is filled into the remaining first and second interconnect patterns utilizing a conventional deposition process including, but not limited to CVD, PECVD, sputtering, chemical solution deposition or plating.

After deposition, a conventional planarization process such as, for example, chemical mechanical polishing (CMP) can be used to provide a structure in which the diffusion barrier liner and the conductive material 26 each have an upper surface that is substantially coplanar with the upper surface of the cured second low-k material 22'. The resultant structure after filling the openings in the first and second low-k patternable materials and planarization is shown, for example, in FIG. 1G.

Figure 1H:
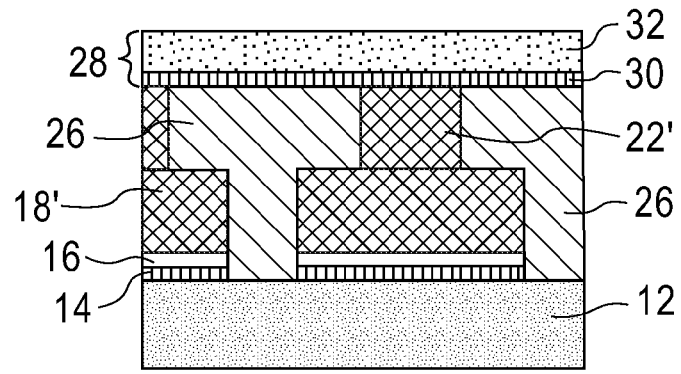

After forming the at least one conductive material 26 a stack 28 including another dielectric cap 30 and a block mask 32 is typically formed on the surface of the cured second low-k material 22'. The structure including stack 28 is shown in FIG. 1H. The dielectric cap 30 of stack 28 is formed utilizing a conventional deposition process such as, for example, CVD, PECVD, chemical solution deposition, or evaporation. The dielectric cap 30 of stack 28 comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap 30 can be a continuous layer or a discontinuous layer. It can also be a select cap, such as CoWP. The thickness of the dielectric cap 30 may vary depending on the technique used to form the same as well as the material make-up of the layer. Typically, the dielectric cap 30 has a thickness from about 15 to about 55 nm, with a thickness from about 25 to about 45 nm being more typical.

The block mask 32 of stack 28 is formed utilizing any conventional deposition process including, for example, CVD, PECVD and spin-on coating. The block mask 32 of stack 28 comprises a standard photoresist material including inorganic, organic and hybrid resists. The block mask 32 may further comprise at least one anti-reflective coating layer and/or at least one hardmask layer. The composition of the anti-reflective coating layer and the hardmask layer can be organic, inorganic or organic/inorganic hybrid materials as long as the combination of their composition and layer thickness satisfies the patterning and pattern transfer needs of the airgaps 34 and 36 (FIGS. 1I and 1J).

Figure 1I:
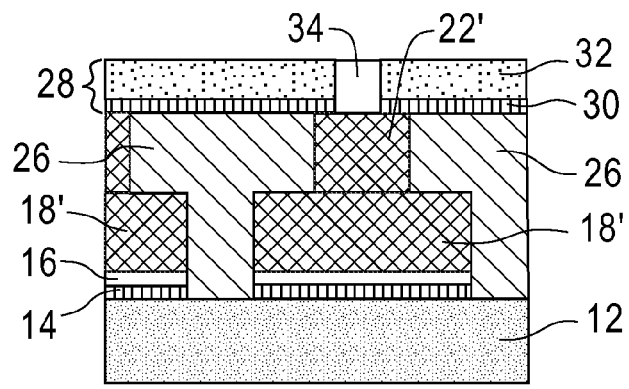
Figure 1J:
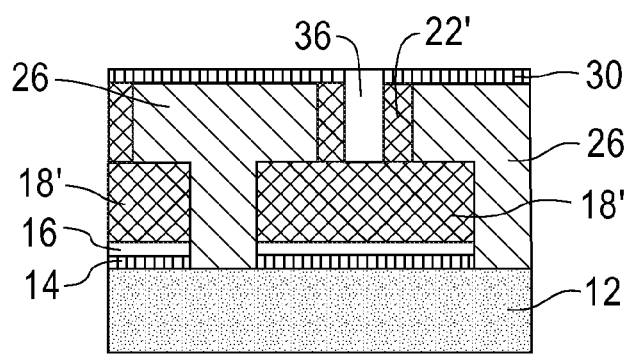

Next, and as is shown in FIG. 1I, the stack 28 is patterned providing an airgap pattern 34 therein. The patterning step includes optical lithography, immersion lithography, EUV, soft lithography, contact printing, nano-printing, E-Beam, maskless direct writing, scanning probe lithography and self-assemble lithography. Note that the feature size of the airgap pattern 34 is less than the metal spacing within the low-k dielectric materials. The patterning step also includes etching such as reactive-ion etching.

The airgap pattern 34 is then transferred into at least the second cured low-k dielectric material 22' utilizing a timed etching process such as, for example, reactive ion etching. After transferring the airgap pattern 34 into the second cured low-k dielectric material 22', the remaining block mask 32 is removed from the structure utilizing a conventional removal method of sacrificial materials such as reactive ion etching, stopping atop the remaining dielectric cap 30. This structure is illustrated in FIG. 1J. In FIG. 1J, reference numeral 36 denotes the airgap opening. As is shown, the transferred airgap pattern is adjacent to, but not directly abutting the conductively filled regions formed into at least the cured second patternable low-k dielectric material.

Figure 1K:
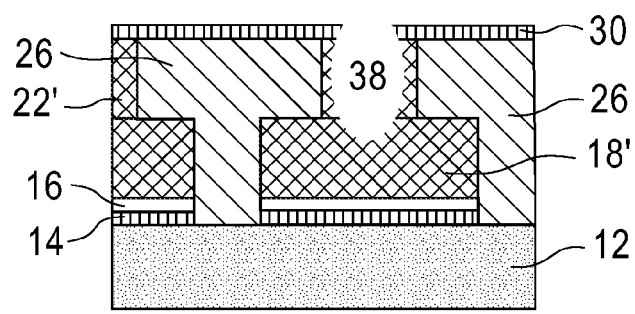

After transferring the airgap pattern into at least the cured second low-k dielectric material 22', portions of the low-k dielectric material that are directly abutting the airgap opening 34 are changed physically, chemically or both so as to have a different removal rate as compared to the remaining low-k dielectric material. This change in removal rate is achieved in the present application, by a chemical treatment, exposure to a reducing or an oxidizing plasma. One preferred embodiment of this material transformation is by an isotropic reactive ion etching. The isotropic ion etching gas chemistry is selected from at least one of $O_2$, CO, $CO_2$, $N_2$, $H_2$, $NH_3$, He, Ar, hydrocarbon and the like. This changed portion of the low-k dielectric directly abutting the airgap opening is then removed utilizing an etching process such as, for example, an isotropic etch utilizing a DHF etchant. A supercritical fluid etching process may also be used in some embodiments of the invention. These two steps, e.g., changing the etch selectivity of portions of the low-k dielectric material and etching, provides an airgap 38 within the structure. The airgap 38 may include air or a vacuum. A pump may be used to remove the air from the airgap 38 to form a vacuum. The resultant structure including the airgap 38 is shown in FIG. 1K.

Figure 1L:
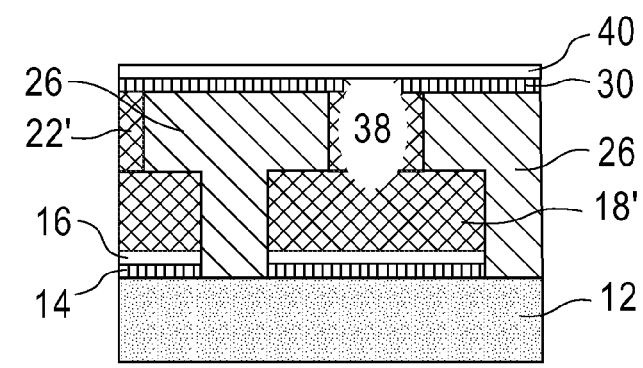

Next, and as shown in FIG. 1L, an airgap cap 40 is formed atop the dielectric cap 30 sealing the airgap 38 in the structure. The airgap cap 40 includes an ARC including a conventional inorganic ARC and the inorganic ARC described above. In a preferred embodiment, the airgap cap 40 is the same as the inorganic ARC 16. The composition and method of its deposition was described above.

In addition to the dual-damascene embodiment mentioned above, the present invention also contemplates a single-damascene embodiment.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
at least one patterned and cured low-k dielectric material located on an upper surface of a patterned inorganic antireflective coating that is located atop a substrate, wherein said inorganic antireflective coating comprises atoms of M, C and H wherein M is at least one of Si, Ge, B, Sn, Fe, Ta, Ti, Ni, Hf and La, said at least one cured and patterned low-k dielectric material and said patterned inorganic antireflective coating having conductively filled regions embedded therein and said at least one cured and patterned low-k dielectric material having at least one airgap located adjacent, but separated from the conductively filled regions by a portion of said low-k dielectric material.

2. The interconnect structure of claim 1 wherein said inorganic antireflective coating further comprises atoms of O, N, S, F or mixtures thereof.

3. The interconnect structure of claim 1 wherein said at least one patterned and cured low-k dielectric material comprises a cured functionalized polymer having one or more irradiation/acid-sensitive imageable groups.

4. The interconnect structure of claim 3 wherein said functionalized polymer comprises a polymer of a hydrocarbon, a fluorinated hydrocarbon, a siloxane, a silane, a carbosilane, an oxycarbosilane, an organosilicate or a silsesquioxane.

5. The interconnect structure of claim 3 wherein said functionalized polymer further comprises a functionalized sacrificial pore generator.

6. The interconnect structure of claim 1 further comprising a dielectric cap located on an uppermost surface of said at least one patterned and cured low-k dielectric material, said dielectric cap having an opening in which an upper portion of the at least one airgap extends through.

7. The interconnect structure of claim 6 further comprising an airgap cap located atop said dielectric cap and atop said opening, wherein a portion of said airgap cap located at said opening is in contact with said upper portion of the airgap.

8. The interconnect structure of claim 1 wherein said airgap is filled with air.

9. The interconnect structure of claim 1 wherein said airgap is a vacuum.

10. An interconnect structure comprising:
a lower patterned and cured low-k material layer located on a surface of a patterned inorganic antireflective coating that is located atop a substrate, wherein said inorganic antireflective coating comprises atoms of M, C and H wherein M is at least one of Si, Ge, B, Sn, Fe, Ta, Ti, Ni, Hf and La, and an abutting upper patterned and cured low-k material layer located on said lower patterned and cured low-k material layer, said lower and upper patterned and cured low-k material layers and said patterned inorganic antireflective coating having conductively filled regions and at least said upper patterned and cured low-k film having at least one airgap located adjacent, but separated from the conductively filled regions by a portion of said low-k dielectric material.

11. The interconnect structure of claim 10 wherein said inorganic antireflective coating further comprises atoms of O, N, S, F or mixtures thereof.

12. The interconnect structure of claim 10 wherein said lower and upper patterned and cured low-k dielectric material layers each comprise a cured functionalized polymer having one or more irradiation/acid-sensitive imageable groups.

13. The interconnect structure of claim 10 wherein said functionalized polymer comprises a polymer of a hydrocarbon, a fluorinated hydrocarbon, a siloxane, a silane, a carbosilane, an oxycarbosilane, an organosilicate or a silsesquioxane.

14. The interconnect structure of claim 10 further comprising a dielectric cap located on an uppermost surface of said upper patterned and cured low-k material layer, said dielectric cap having an opening in which an upper portion of the at least one airgap extends through.

15. The interconnect structure of claim 10 wherein said airgap is filled with air.

16. The interconnect structure of claim 10 wherein said airgap is a vacuum.

17. An interconnect structure comprising:
- an inorganic antireflective coating located atop a substrate, wherein said inorganic antireflective coating comprises atoms of M, C and H wherein M is at least one of Si, Ge, B, Sn, Fe, Ta, Ti, Ni, Hf and La;
- at least one low-k dielectric material comprising a cured functionalized polymer having one or more irradiation/acid-sensitive imageable groups and located on a surface of said inorganic antireflective coating;
- at least one conductive structure embedded in said at least one low-k dielectric material and extending into said inorganic antireflective coating, wherein an uppermost surface of said at least one conductive structure is coplanar with an uppermost surface of said at least one low-k dielectric material;
- at least one airgap located in said at least one low-k dielectric material, wherein a portion of said at least one low-k dielectric material separates an entire sidewall surface of said at least one airgap from an adjacent sidewall surface of said at least one conductive structure;
- a dielectric cap located on said uppermost surface of said at least one low-k dielectric material and having an opening in which an upper portion of said at least one airgap extends through, wherein a portion of a bottommost surface of said dielectric cap is in direct physical contact with said uppermost surface of said at least one conductive structure; and
- an airgap cap located on an uppermost surface of dielectric cap and extending over said opening, wherein a portion of said airgap cap located at said opening is in contact with said upper portion of said at least one airgap, and wherein said upper portion of said at least one airgap does not extend above said uppermost surface of said dielectric cap.

18. An interconnect structure comprising:
- an inorganic antireflective coating located atop a substrate, wherein said inorganic antireflective coating comprises atoms of M, C and H wherein M is at least one of Si, Ge, B, Sn, Fe, Ta, Ti, Ni, Hf and La;
- a lower low-k dielectric material layer comprising a first cured functionalized polymer having one or more irradiation/acid-sensitive imageable groups and located on a surface of said inorganic antireflective coating;
- an upper low-k dielectric material layer comprising a second cured functionalized polymer having one or more irradiation/acid-sensitive imageable groups and located directly on a surface of said lower low-k dielectric material layer;
- at least one conductive structure embedded in said upper and lower low-k dielectric material layers and extending into said inorganic antireflective coating, wherein an uppermost surface of said at least one conductive structure is coplanar with an uppermost surface of said upper low-k dielectric material layer;
- at least one airgap located in said at least said upper low-k dielectric material layer, wherein a portion of said upper low-k dielectric material layer separates an entire sidewall surface of said at least one airgap from an adjacent sidewall surface of said at least one conductive structure;
- a dielectric cap located on said uppermost surface of said upper low-k dielectric material layer and having an opening in which an upper portion of said at least one airgap extends through, wherein a portion of a bottommost surface of said dielectric cap is in direct physical contact with said uppermost surface of said at least one conductive structure; and
- an airgap cap located on an uppermost surface of dielectric cap and extending over said opening, wherein a portion of said airgap cap located at said opening is in contact with said upper portion of said at least one airgap, and wherein said upper portion of said at least one airgap does not extend above said uppermost surface of said dielectric cap.

* * * * *